United States Patent
Shibata et al.

(10) Patent No.: US 7,018,915 B2
(45) Date of Patent: Mar. 28, 2006

(54) GROUP III NITRIDE COMPOUND SEMICONDUCTOR DEVICE AND METHOD FOR FORMING AN ELECTRODE

(75) Inventors: Naoki Shibata, Aichi-ken (JP); Toshiya Uemura, Aichi-ken (JP); Makoto Asai, Aichi-ken (JP); Yasuo Koide, Ibaragi-ken (JP); Masanori Murakami, Kyoto (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/860,035

(22) Filed: Jun. 4, 2004

(65) Prior Publication Data

US 2004/0222499 A1    Nov. 11, 2004

Related U.S. Application Data

(62) Division of application No. 10/239,895, filed as application No. PCT/JP01/01178 on Feb. 19, 2001, now Pat. No. 6,806,571.

(30) Foreign Application Priority Data

Mar. 27, 2000 (JP) ............................. 2000-85932

(51) Int. Cl.
H01L 21/28 (2006.01)
H01L 33/00 (2006.01)

(52) U.S. Cl. ............... 438/602; 438/46; 438/47; 438/604; 257/99; 257/744; 257/745

(58) Field of Classification Search ............... 438/602, 438/604, 22, 46, 47, 956; 257/96–99, 744–745
See application file for complete search history.

(56) References Cited

U.S. PATENT DOCUMENTS 5,164,850 A * 11/1992 Tanaka et al. ............... 349/51

(Continued)

FOREIGN PATENT DOCUMENTS

JP    6-314822    11/1994

(Continued)

OTHER PUBLICATIONS

C.A. Dimitriadis et al., "COntacts of titaniumm nitride to n- and p-type gallium nitride films", Solid-State Electronics 43 (1999) 1969-1972.*

(Continued)

Primary Examiner—Donghee Kang
(74) Attorney, Agent, or Firm—McGinn IP Law Group, PLLC

(57) ABSTRACT

An AlN buffer layer 2; a silicon (Si)-doped GaN high-carrier-concentration n$^+$ layer 3; an Si-doped n-type $Al_{0.07}Ga_{0.93}N$ n-cladding layer 4; an Si-doped n-type GaN n-guide layer 5; an active layer 6 having a multiple quantum well (MQW) structure, and including a $Ga_{0.9}In_{0.1}N$ well layer 61 (thickness: about 2 nm) and a $Ga_{0.97}In_{0.03}N$ barrier layer 62 (thickness: about 4 nm), the layers 61 and 62 being laminated alternately; an Mg-doped GaN p-guide layer 7; an Mg-doped $Al_{0.07}Ga_{0.93}N$ p-cladding layer 8; and an Mg-doped GaN p-contact layer 9 are successively formed on a sapphire substrate. A p-electrode 10 is formed of a film of titanium nitride (TiN) or tantalum nitride (TaN) (thickness: 50 nm). The contact resistance of this electrode is reduced through heat treatment.

7 Claims, 4 Drawing Sheets

U.S. PATENT DOCUMENTS 5,563,422 A     10/1996   Nakamura et al.
5,701,035 A * 12/1997   Teraguchi ................... 257/747
6,242,328 B1 *   6/2001   Shin .......................... 438/518
6,281,526 B1 *   8/2001   Nitta et al. ................. 257/103

FOREIGN PATENT DOCUMENTS

JP     10-321954     12/1998
JP     11-330546     11/1999

OTHER PUBLICATIONS

Luther et al., "Titanium and titanium nitride contacts to n-type gallium nitride", Semicond. Sci. Technol. 13 (1998) pp. 1322-1327.

Dimitriadis et al., "Contacts of titanium nitride to n-and p-type gallium nitride films", Solid-State Electronics 43 (1999), pp. 1969-1972.

* cited by examiner

HEAT TREATMENT TEMPERATURE [°C]

GROUP III NITRIDE COMPOUND SEMICONDUCTOR DEVICE AND METHOD FOR FORMING AN ELECTRODE

The present Application is a Divisional Application of U.S. patent application Ser. No. 10/239,895 filed on Feb. 19, 2003, now U.S. Pat. No. 6,806,571, which is a 371 of PCT/JP01/01178, filed Feb. 19, 2001.

TECHNICAL FIELD

The present invention relates to a device including an electrode which has low contact resistance to a p-type Group III nitride compound semiconductor, and which does not occur any chemical reaction such as oxidation as time passes. The present invention also relates to a method for forming the electrode. As used herein, the term "Group III nitride compound semiconductor" refers to a semiconductor generally represented by the following formula: $Al_xGa_yIn_{1-x-y}N$ ($0 \leq x \leq 1$, $0 \leq y \leq 1$, $0 \leq x+y \leq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (in each case, $0<x<1$); and quaternary semiconductors represented by the following formula: $Al_xGa_yIn_{1-x-y}N$ ($0<x<1$, $0<y<1$, $0<x+y<1$). Unless otherwise specified, in the present specification, the term "Group III nitride compound semiconductor" also includes p-type or n-type Group III nitride compound semiconductors doped with an impurity.

BACKGROUND ART

Group III nitride compound semiconductors have direct transition and whose emission spectrum can be changed over a wide range from UV to red when used in a device such as a light-emitting device. Therefore Group III nitride compound semiconductor have been used in light-emitting devices such as a light-emitting diodes (LEDs) and laser diodes (LDs). In addition, since a Group III nitride compound semiconductor has a wide band gap, a device employing the semiconductor is considered to be operated reliably at high temperature, as compared with a device employing a semiconductor other than a Group III nitride compound semiconductor. Therefore, applying group III nitride compound semiconductors to electron devices including an FET, have been developed. Moreover, because arsenic (As) is not contained in Group III nitride compound semiconductors as a main constitution element, application of the semiconductors to the various semiconductor devices has been expected from the environmental viewpoint.

In general, when a metallic layer is merely formed on the surface of a compound semiconductor, ohmic contact between the metallic layer and the compound semiconductor fails to be obtained. Therefore, conventionally, the ohmic contact can be obtained by thermal treatment of the sample to diffuse the metal in the semiconductor. In the case of a p-type Group III nitride compound semiconductor, a resistivity of the p-type Group III nitride semiconductor is not reduce to the same level of that of n-type semiconductor, even the sample is taken heat treatment process or electron beam irradiation process. Therefore, the current does not spread in a lateral direction in the p-type layer, but flows just below electrade. Accordingly light is emitted merely from a portion directly beneath the electrode. To solve this problem, there has been proposed a current-diffusing electrode which is formed by laminating a nickel (Ni) layer (thickness: some hundreds Å) and a gold (Au) layer (thickness: some hundreds Å) and performing heat treatment thereafter, which exhibits light transmittance and ohmic characteristics (Japanese Patent Application Laid-Open (kokai) No. 6-314822). However, this electrode of two-layer structure including a nickel (Ni) layer and a gold (Au) layer has a contact resistivity as high as $2 \times 10^{-3}$ $\Omega cm^2$ when the electrode contacts with a p-type Group III nitride compound semiconductor but the resistivity is still high. Therefore, a Group III nitride compound semiconductor device having this electrode still has a high operation voltage.

DISCLOSURE OF THE INVENTION

The present inventors have previously applied for a patent regarding an invention related to a p-electrode including a titanium (Ti) layer and a tantalum (Ta) layer (Japanese Patent Application No. 10-202697). This p-electrode is superior to the aforementioned electrode of two-layer structure including a nickel (Ni) layer and a gold (Au) layer in terms of initial contact resistivity, but there still remains room for improvement of the p-electrode. That is, when the p-electrode including a titanium (Ti) layer and a tantalum (Ta) layer is exposed to air for one week, the contact resistance of the electrode increases by a factor of about 1,000. The reason for the increase in contact resistance is thought to be as follows: the two-metallic-layer electrode is oxidized by oxygen and moisture contained in air; or a metal nitride is formed by nitrogen contained in a Group III nitride compound semiconductor which is in contact with the electrode. As a result, the ohmic contact can not keep low contact resistance.

The present invention has been accomplished in order to solve the aforementioned problems. An object of the present invention is to provide an electrode which has low contact resistance to a p-type Group III nitride compound semiconductor, and which does not occur any chemical reaction such as oxidation as time passes.

In order to solve the aforementioned problems, a first feature of the invention can be employed. Through use of this feature, a member selected from the group consisting a titanium nitride ($TiN_x$) electrode, a tantalum nitride ($TaN_x$) electrode, and a tantalum titanium nitride ($Ta_yTi_{1-y}N_z$) electrode is formed on a p-type Group III nitride compound semiconductor. The titanium nitride ($TiN_x$) electrode, tantalum nitride ($TaN_x$) electrode, or tantalum titanium nitride ($Ta_yTi_{1-y}N_z$) electrode formed on the p-type Group III nitride compound semiconductor is not oxidized by oxygen or moisture contained in air, and is not chemically reacted with nitrogen (N) atoms contained in the Group III nitride compound semiconductor which is in contact with the electrode. Therefore, the characteristics of the titanium nitride ($TiN_x$) electrode, tantalum nitride ($TaN_x$) electrode, and tantalum titanium nitride ($Ta_yTi_{1-y}N_z$) electrode do not vary as time passes. A reduction of the contact resistance greatly contributes to suppression of generating heat in a semiconductor device, and improving the life time of the device.

A second feature of the invention includes heat treatment of a member selected from the group consisting the tantalum nitride ($TaN_x$) electrode, titanium nitride ($TiN_x$) electrode, and tantalum titanium nitride ($Ta_yTi_{1-y}N_z$) electrode at 700 to 1,000° C. after deposition of the electrode. Because the tantalum nitride ($TaN_x$) electrode, titanium nitride ($TiN_x$) electrode, or tantalum titanium nitride ($Ta_yTi_{1-y}N_z$) electrode is alloyed with the Group III nitride compound semiconductor which is in contact with the electrode through this heat treatment, the value of the contact resistance can be further reduced.

A third feature of the invention is a method for forming a p-electrode of a device including a p-type Group III nitride compound semiconductor, the method comprising forming the p-electrode made of a member selected from the group consisting tantalum nitride (TaN$_x$), titanium nitride (TiN$_x$), and tantalum titanium nitride (Ta$_y$Ti$_{1-y}$N$_z$) by sputtering. Such metal nitride electrode can be formed readily by sputtering.

A fourth feature of the invention includes reactive sputtering by use of a mixing gas of nitrogen and a rare gas. By employment of a mixing gas of nitrogen and a rare gas, nitrogen atoms for forming a metal nitride can be readily generated, and thus such a metal nitride electrode can be formed more readily.

A fifth feature of the invention includes heat treatment at 700 to 1,000° C. after sputtering. Through heat treatment, the metal nitride electrode is alloyed with the Group III nitride compound semiconductor which is in contact with the electrode, and therefore, contact resistance can be further reduced.

The present invention can be carried out with reference to the following description.

A metal nitride electrode is preferably formed of electrically conductive titanium nitride (TiN) or tantalum nitride (TaN). The electrode may be formed of zirconium nitride (ZrN), niobium nitride (NbN), or tungsten nitride (WN). Furthermore, the electrode may be formed of a mixture of these metal nitrides. The metal nitride electrode may be formed by, for example, reactive sputtering. In the case of sputtering, introduction of nitrogen (N) atoms is required. Introduction of nitrogen atoms can be realized through reaction in a gas mixture of nitrogen (N$_2$) and an inert gas such as a rare gas (e.g., helium (He), neon (Ne), argon (Ar), or krypton (Kr)). After formation of the electrode, heat treatment is preferably carried out at 700 to 1,000° C., more preferably at 800 to 950° C.

When Group III nitride compound semiconductor layers are successively formed on a substrate, the substrate may be formed of an inorganic crystal compound such as sapphire, silicon (Si), silicon carbide (SiC), spinel (MgAl$_2$O$_4$), ZnO, or MgO; a Group III–V compound semiconductor such as gallium phosphide or gallium arsenide; or a Group III nitride compound semiconductor such as gallium nitride (GaN). The Group III nitride compound semiconductor layers are preferably formed by metal-organic chemical vapor deposition (MOCVD) or metal-organic vapor phase epitaxy (MOVPE), but may be formed by molecular beam epitaxy (MBE), halide vapor phase epitaxy (Halide VPE), or liquid phase epitaxy (LPE). The Group III nitride compound semiconductor layers may be formed by different growth methods.

For example, when layers of a Group III nitride compound semiconductor are formed on a sapphire substrate, in order to obtain a high quality simple crystal, it is preferable to form a buffer layer so as to compensate lattice mismatching with the sapphire substrate. It is also preferable to provide a buffer layer when using the different substrate. As a buffer layer, a Group III nitride compound semiconductor which is formed at a low temperature such as Al$_x$Ga$_y$In$_{1-x-y}$N (0≦x≦1, 0≦y≦1, 0≦x+y≦1) and more preferably Al$_x$Ga$_{1-x}$N (0≦x≦1) is used. This buffer layer may be a single layer or multiple layers having different compositions. The buffer layer may be formed at a low temperature of 380 to 420° C., or the buffer layer may be formed by MOCVD at a temperature in the range of 1,000 to 1,180° C. Alternatively, a buffer layer comprising AlN can be formed by reactive sputtering using a DC magnetron sputtering apparatus and high purity metallic aluminum and nitrogen gas are used for source material. Similarly, a buffer layer expressed by the general formula Al$_x$Ga$_y$In$_{1-x-y}$N (0≦x≦1, 0≦y≦1, 0≦x+y≦1, with the composition ratio being arbitrary) can be formed. Furthermore, it is possible to use the vapor deposition method, the ion plating method, the laser abrasion method, or the ECR method. Formation of the buffer layer by physical vapor deposition is preferably carried out at a temperature in the range of 200 to 600° C. More preferably it is carried out at a temperature in the range of 300 to 600° C. and still more preferably in the range of 350 to 450° C. When a physical vapor deposition method such as these sputtering methods is used, the thickness of the buffer layer is preferably in the range of 100 to 3,000 Å. More preferably it is in the range of 100 to 400 Å, and most preferably it is in the range of 100 to 300 Å. A multi layer may comprise, for example, alternating Al$_x$Ga$_{1-x}$N (0≦x≦1) layers and GaN layers. Alternatively, a multi layer may comprise alternating layers of the same composition formed at a temperature of not higher than 600° C. and at a temperature of not lower than 1000° C. Of course, these arrangements may be combined. Also, a multi layer may comprise three or more different types of Group III nitride compound semiconductors Al$_x$Ga$_y$In$_{1-x-y}$N (0≦x≦1, 0≦y≦1, 0≦x+y≦1). Generally, a buffer layer is amorphous and an intermediate layer is singlecrystalline. Repetitions of unit of a buffer layer and an intermediate layer may be formed, and the number of repetitions is not particularly limited. The greater the number of repetitions, the more improvement in crystallinity.

A portion of Group III elements of a buffer layer and that of a Group III nitride compound semiconductor formed on the buffer layer may be replaced with boron (B) or thallium (Tl), or a portion of nitrogen (N) atoms of a buffer layer or that of a Group III nitride compound semiconductor formed on the buffer layer may be replaced with phosphorus (P), arsenic (As), antimony (Sb), or bismuth (Bi). Also, the buffer layer and the Group III nitride compound semiconductor may be doped with any elements which cannot express the composition thereof. For example, a Group III nitride compound semiconductor which is represented by Al$_x$Ga$_{1-x}$N (0≦x≦1) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity by compensation, that is, the expansion strain by doped large atom compensates the compressive strain by nitrogen vacancy. In this case, since acceptor impurities easily occupy the positions of Group III atoms, p-type conductivity can be obtained as grown. Through the thus-attained improvement of crystallinity combined with the features of the present invention, dislocation density can be more reduced to approximately 1/100 to 1/1000. In the case of an underlying layer comprising two or more repetitions of a buffer layer and a Group III nitride compound semiconductor layer, the Group III nitride compound semiconductor layers are further preferably doped with an element greater in atomic radius than a predominant component element. In the case where a light-emitting device is a target product, use of a binary or ternary Group III nitride compound semiconductor is preferred.

When an n-type Group III nitride compound semiconductor layer is formed, a Group IV or Group VI element, such as Si, Ge, Se, Te, or C, can be used as an n-type impurity. A Group II or Group IV element, such as Zn, Mg, Be, Ca, Sr, or Ba, can be used as a p-type impurity. The same layer may be doped with a plurality of n-type or p-type impurities or doped with both n-type and p-type impurities.

Optionally, dislocations of a Group III nitride compound semiconductor layer may be reduced through lateral epitaxial overgrowth. In order to reduce dislocations, lateral epitaxial growth. Here a mask may be performed, or trenches formed through etching may be filled through lateral epitaxial growth.

An etching mask may be formed of a single film or a multi-layer film formed from a polycrystalline semiconductor such as polycrystalline silicon or a polycrystalline nitride semiconductor; an oxide or a nitride, such as silicon oxide ($SiO_x$), silicon nitride ($SiN_x$), titanium oxide ($TiO_x$), or zirconium oxide ($ZrO_x$); or a metal of high melting point, such as titanium (Ti) or tungsten (W). The film may be formed through any known method, such as a vapor-growth method (e.g., deposition, sputtering, or CVD).

When etching is carried out, reactive ion-beam etching (RIBE) is preferably performed, but the etching method is not limited to reactive ion-beam etching. Trenches having a V-shaped cross section (i.e., trenches having no bottom surface) may be formed through anisotropic etching, so as not to form trenches having inner walls perpendicular to a substrate.

A semiconductor device such as an FET or a light-emitting device may be formed on a Group III nitride compound semiconductor. When a light-emitting device is formed, a light-emitting layer may have a multiple quantum well (MQW) structure, a single quantum well (SQW) structure, a homo junction structure, a hetero junction structure, or a double hetero junction structure. The light-emitting layer may contain a pin junction or a pn junction.

DETAILED DESCRIPTION OF PREFERRED EMBODIMENTS

Embodiments of the present invention will be described in detail.

An aluminum nitride (AlN) layer was formed on a sapphire substrate whose crystal plane is an A-plane; a gallium nitride (GaN) layer (thickness: 4 µm) was formed on the AlN layer; and a magnesium (Mg)-doped p-GaN layer (thickness: 0.5 µm) was formed on the GaN layer. The p-GaN layer had a hole concentration of $7\times10^{17}$ $cm^{-3}$ and a resistivity of 5 Ωcm.

Figure 1:
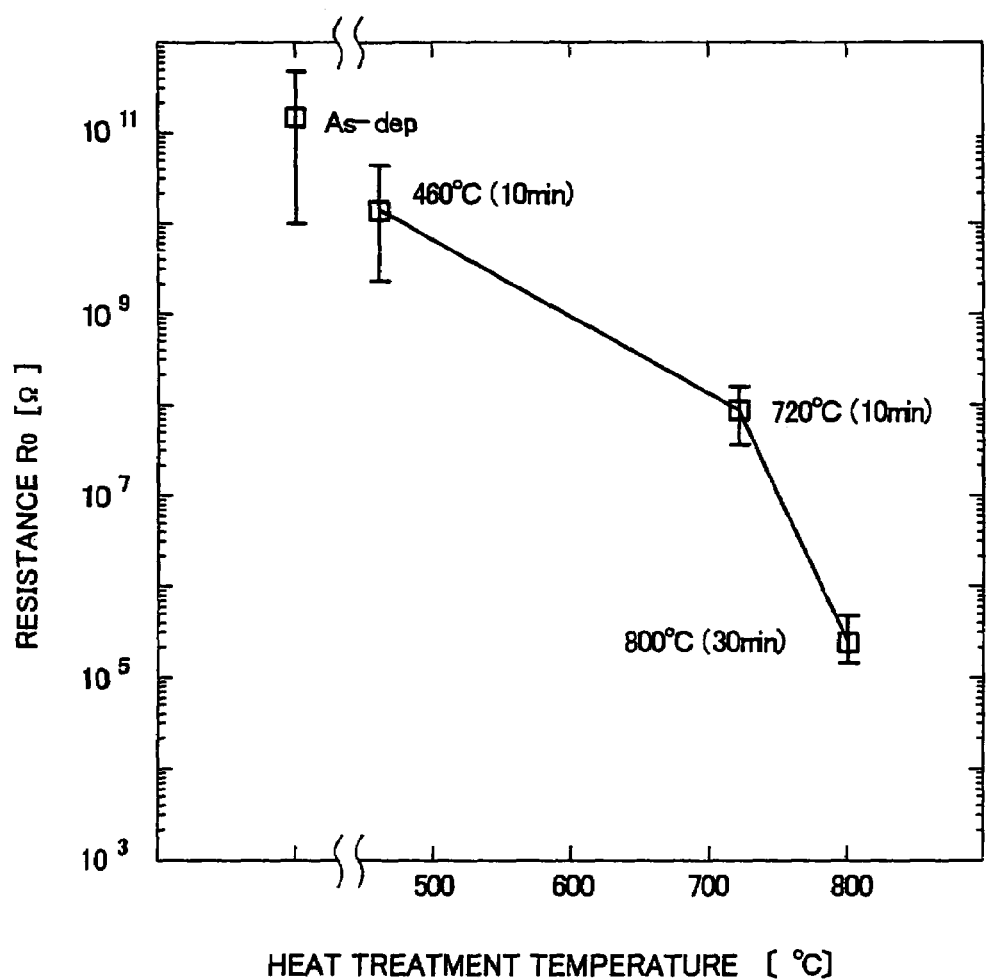
FIG. 1 shows the relation between heat treatment temperature and contact resistance using a TiN electrode formed on a p-GaN layer.
Figure 2:
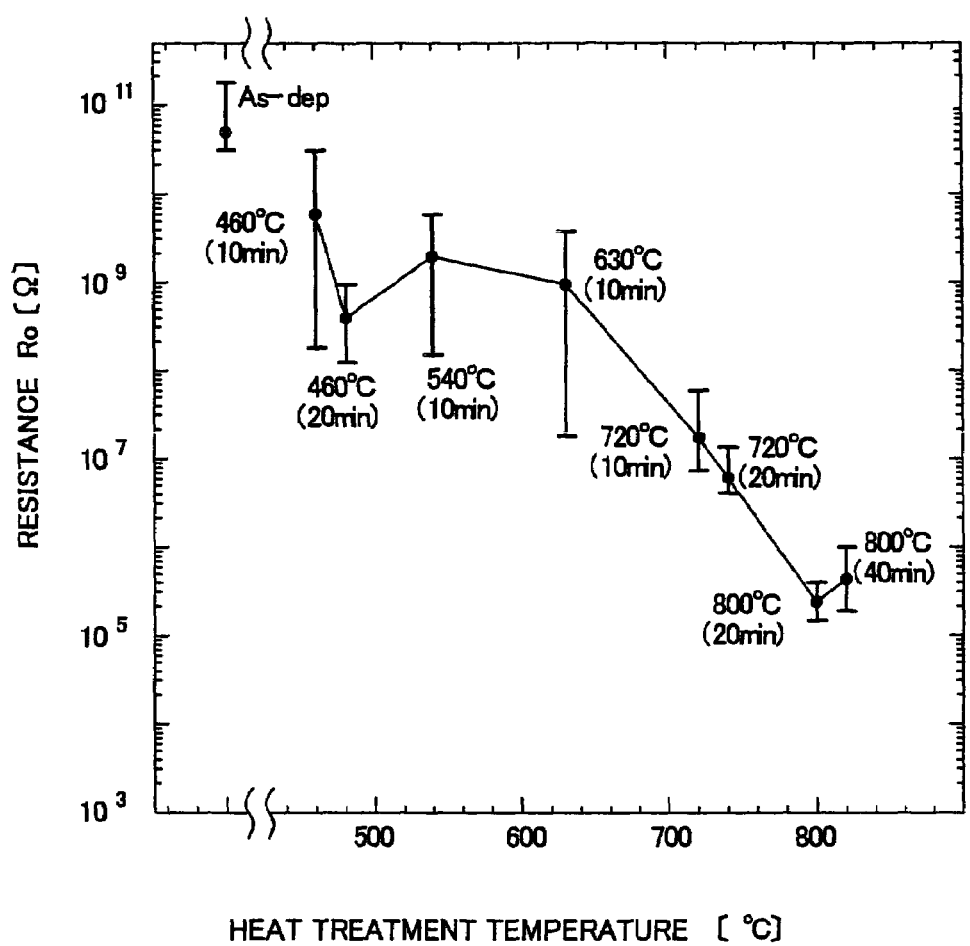
FIG. 2 shows the relation between heat treatment temperature and contact resistance using a TaN electrode formed on a p-GaN layer.

A TiN electrode or TaN electrode was formed on the p-GaN layer to measure a contact resistance in the shape which had a center portion and an annular portion surrounding the center portion. The distance between the center portion and the annular portion was 8 µm. The metal nitride electrode was formed by reactive sputtering employing a gas mixture of argon (Ar) and nitrogen ($N_2$) (ratio, 4:1). Sputtering was performed at 100 W and 0.67 Pa. The values of the contact resistance of the as-deposited TiN electrode and TaN electrode, the contact resistance after heat-treatment at 460° C. to 800° C. for 10 to 40 minutes are shown in FIGS. 1 and 2, respectively. Here heat treatment was carried out under high vacuum (i.e., $1.3\times10^{-6}$ Pa). In X-ray diffraction analysis, the thus-formed TiN electrode and TaN electrode were found to exhibit a peak corresponding to a (111) plane and a peak corresponding to a (11-20) plane, respectively. It is considered from the results that the metallic atom is trivalent and the metallic atom is stoichiometrically bonded to a nitrogen atom at a 1:1 ratio.

FIG. 1 shows the relationship between heat treatment temperature and the contact resistance of the TiN electrode. As shown in FIG. 1, when heat treatment is carried out at 460° C. for 10 minutes, the contact resistance of the electrode is reduced to about 1/10 compared with that of the as-deposited electrode, but the value thereof of the thus-heated electrode is still very high, as high as about $10^{10}$ Ω. In contrast, when heat treatment is carried out at 720° C. for 10 minutes, the contact resistance of the electrode is considerably reduced to about $10^8$ Ω, and when heat treatment is carried out at 800° C. for 30 minutes, the value of the contact resistance of the electrode is considerably reduced to about $2\times10^5$ Ω.

FIG. 2 shows the relationship between heat treatment temperature and the value of the contact resistance of the TaN electrode. As shown in FIG. 2, the as-deposited TaN electrode before the heat-treatment has a resistance of about $10^{11}$ Ω. When heat treatment is carried out at 460 to 630° C. for 10 or 20 minutes, the contact resistance of the electrode is reduced to $4\times10^8$ to $6\times10^9$ Ω but a remarkable reduction of resistance is not observed. In contrast, when heat treatment is carried out at 720° C. for 10 or 20 minutes, the contact resistance of the electrode is considerably reduced to about $10^7$ Ω, and when heat treatment is carried out at 800° C. for 20 or 40 minutes, the contact resistance of the electrode is more remarkably reduced to $2\times10^5$ to $3\times10^5$ Ω.

The contact resistance of the TiN electrode or TaN electrode increases only by a factor of about 10 or less after five days pass. That is, as compared with the case of the aforementioned titanium (Ti)/tantalum (Ta) two-layer electrode in which the contact resistance increases by a factor of 1,000 or more after six days pass, the above-formed electrode exhibits very remarkable improvement.

Figure 3:
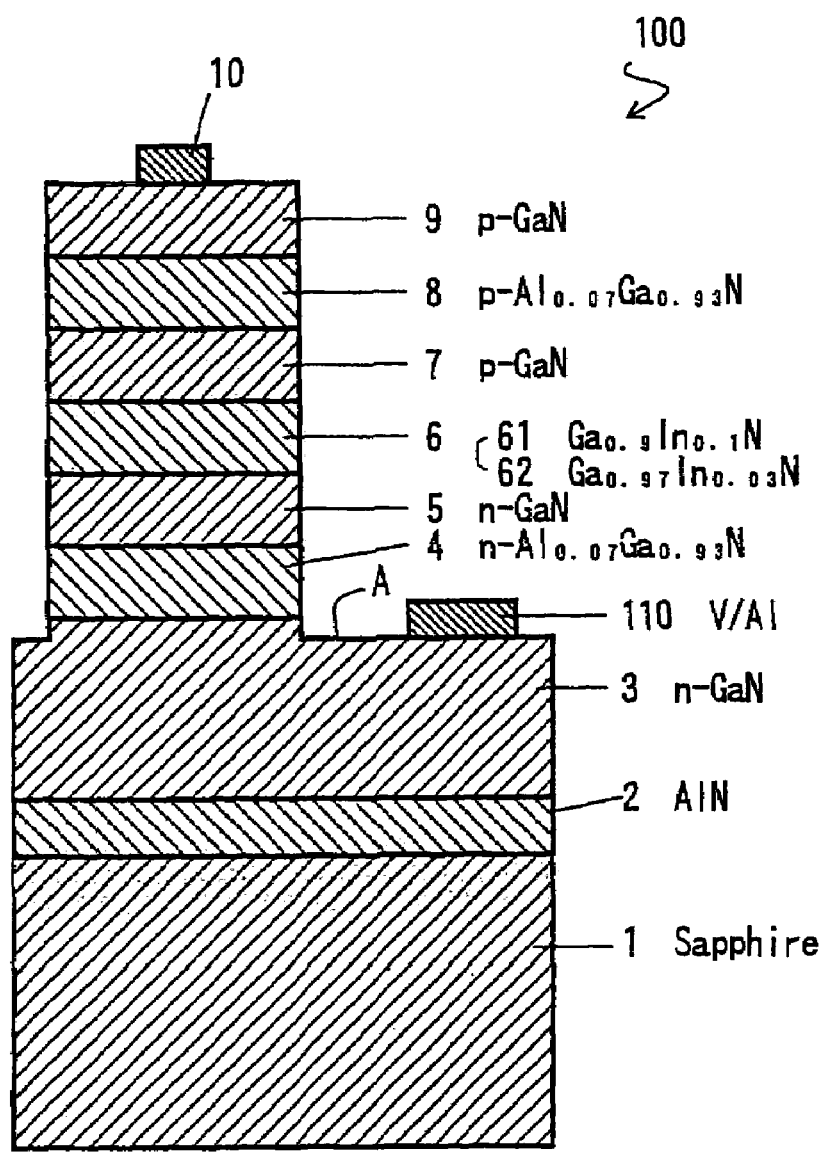
FIG. 3 is a schematic diagram showing the structure of a Group III nitride compound semiconductor device of a first embodiment of the present invention.

Embodiments of the present invention which is applied to light-emitting devices will next be described. FIG. 3 is a schematic diagram of cross-sectional view of a laser diode 100 according to a first embodiment of the invention, which includes a GaN-based compound semiconductor formed on a sapphire substrate 1.

As shown in FIG. 3, the laser diode 100 includes the sapphire substrate 1, and an AlN buffer layer 2 (thickness: 30 nm) is formed on the sapphire substrate 1. On the buffer layer 2 are successively formed a silicon (Si)-doped GaN high-carrier-density $n^+$ layer 3 (thickness: about 5 µm, electron density: $1\times10^{18}/cm^3$); a silicon (Si)-doped $Al_{0.07}Ga_{0.93}N$ n-cladding layer 4 (thickness: about 0.6 µm, electron density: $1\times10^{18}/cm^3$); and a silicon (Si)-doped GaN n-guide layer 5 (thickness: 80 nm, electron density: $1\times10^{18}/cm^3$). An active layer 6 having a multiple quantum well (MQW) structure is formed on the n-guide layer 5. The active layer 6 includes six $Ga_{0.9}In_{0.1}N$ well layers 61 (thickness of each layer: about 2 nm), and five $Ga_{0.97}In_{0.03}N$ barrier layers 62 (thickness of each layer: about 4 nm), the layers 61 and 62 being laminated alternately. The uppermost layer of the active layer 6 is the $Ga_{0.9}In_{0.1}N$ well layer 61 (thickness: about 2 nm). On the active layer 6 are successively formed a magnesium (Mg)-doped GaN p-guide layer 7 (thickness: 80 nm, hole density: $3\times10^{17}/cm^3$); a magnesium (Mg)-doped $Al_{0.07}Ga_{0.93}N$ p-cladding layer 8 (thickness: 600 nm, hole density: $3\times10^{17}/cm^3$); and a magnesium (Mg)-doped GaN p-contact layer 9 (thickness: 200 nm, hole density: $1\times10^{18}/cm^3$). A metal nitride electrode 10 of the present invention is formed on the p-contact layer 9. An electrode 110 comprising vanadium (V) and Al is formed on the n+ layer 3.

Next will be described a method for producing the laser diode 100 having the aforementioned structure.

The aforementioned laser diode 100 was produced through metal-organic vapor phase epitaxy (hereinafter abbreviated as "MOVPE"). The following gasses were employed: $NH_3$, a carrier gas ($H_2$ or $N_2$), trimethylgallium ($Ga(CH_3)_3$, hereinafter abbreviated as "TMG"), trimethylaluminum ($Al(CH_3)_3$, hereinafter abbreviated as "TMA"), trimethylindium ($In(CH_3)_3$, hereinafter abbreviated as "TMI"), silane ($SiH_4$), and cyclopentadienylmagnesium ($Mg(C_5H_5)_2$, hereinafter abbreviated as "$Cp_2Mg$").

Firstly, $H_2$, $NH_3$, and TMA were introduced, to thereby form the AlN buffer layer 2 (thickness: about 30 nm) on the sapphire substrate 1. Subsequently, $H_2$, $NH_3$, TMG, and silane ($SiH_4$) which had been diluted with $H_2$ gas to 0.86 ppm were introduced, to thereby form the silicon (Si)-doped GaN n+ layer 3 (thickness: about 5 μm, electron density: $1\times10^{18}/cm^3$).

After the aforementioned n+ layer 3 was formed, $H_2$, $NH_3$, TMA, TMG, and silane ($SiH_4$) which had been diluted with $H_2$ gas to 0.86 ppm were introduced, to thereby form the silicon (Si)-doped $Al_{0.07}Ga_{0.93}N$ n-cladding layer 4 (thickness: 600 nm, electron density: $1\times10^{18}/cm^3$). Subsequently, $H_2$, $NH_3$, TMG, and silane ($SiH_4$) which had been diluted with $H_2$ gas to 0.86 ppm were introduced, to thereby form the silicon (Si)-doped GaN n-guide layer 5 (thickness: 80 nm, electron density: $1\times10^{18}/cm^3$).

Subsequently, $N_2$ or $H_2$, $NH_3$, TMG, and TMI were introduced, to thereby form the $Ga_{0.9}In_{0.1}N$ well layer 61 (thickness: about 2 nm). Subsequently, $N_2$ or $H_2$, $NH_3$, TMG, and TMI were fed, to thereby form the $Ga_{0.97}In_{0.03}N$ barrier layer 62 (thickness: about 4 nm). The well layer 61 and the barrier layer 62 were deposited alternately (number of deposition cycles: 5). Thereafter, the uppermost layer; i.e., the $Ga_{0.9}In_{0.1}N$ well layer 61 (thickness: about 2 nm), was formed. Thus, the active layer 6 having an MQW structure was formed.

Subsequently, $N_2$ or $H_2$, $NH_3$, TMG, and $Cp_2Mg$ were introduced, to thereby form the magnesium (Mg)-doped GaN p-guide layer 7 (thickness: about 80 nm). Subsequently, $N_2$ or $H_2$, $NH_3$, TMA, TMG, and $Cp_2Mg$ were introduced, to thereby form the magnesium (Mg)-doped $Al_{0.07}Ga_{0.93}N$ p-cladding layer 8 (thickness: about 600 nm). Subsequently, $N_2$ or $H_2$, $NH_3$, TMG, and $Cp_2Mg$ were introduced, to thereby form the magnesium (Mg)-doped GaN p-contact layer 9 (thickness: about 100 nm).

Subsequently, the p-contact layer 9, the p-cladding layer 8, and the p-guide layer 7 were uniformly irradiated with electron beams by use of an electron beam irradiation apparatus. Through irradiation of electron beams, the hole densities of the p-contact layer 9, p-cladding layer 8, and p-guide layer 7 became $1\times10^{18}/cm^3$, $3\times10^{17}/cm^3$, and $3\times10^{17}/cm^3$, respectively. Thus, a wafer having a multi-layer structure was produced.

The electrodes are formed in a manner described below.

In order to form an electrode on the n+ layer 3, an etching mask was formed on the p-contact layer 9; a predetermined region of the mask was removed; and a portion of the p-contact layer 9, the p-cladding layer 8, the p-guide layer 7, the active layer 6, the n-guide layer 5, the n-cladding layer 4, and the n+ layer 3, which was not covered with the mask, were etched by RIE (reactive ion etching) process employing a chlorine-containing gas, to thereby expose the surface of the n+ layer 3. A vanadium (V) film (thickness: 20 nm) and a film made of at least one of Al and an Al alloy (thickness: 1.8 μm) were deposited onto the exposed surface of the n+ layer 3 by an electron beam evaporation method, to thereby form the electrode 110. The metal nitride electrode 10 comprising at least one of titanium nitride (TiN) and tantalum nitride (TaN) (thickness: 50 nm) was formed by the aforementioned reactive sputtering on a portion of the p-contact layer 9.

After the electrodes 10 and 110 were formed, a chamber in which the thus-produced laser diode was placed was evacuated to about $1.3\times10^{-6}$ Pa or less by use of a vacuum pump, and the temperature of the environment was risen to about 800° C. and the laser diode was heated for about 15 minutes. As a result, alloying of the contact layer 9 and the metal nitride electrode 10 and alloying of the electrode 110 and the n+ layer 3 were completed.

The value of the contact resistivity of the above-produced electrode 10 was measured by means of a transmission line model (TLM) method. As a result, the value of the contact resistivity was found to be $2\times10^{-5}$ $\Omega cm^2$, and the value of the contact resistivity was not increased with passage of time. The threshold of the laser diode 100 could be reduced by about 5%.

Figure 4:
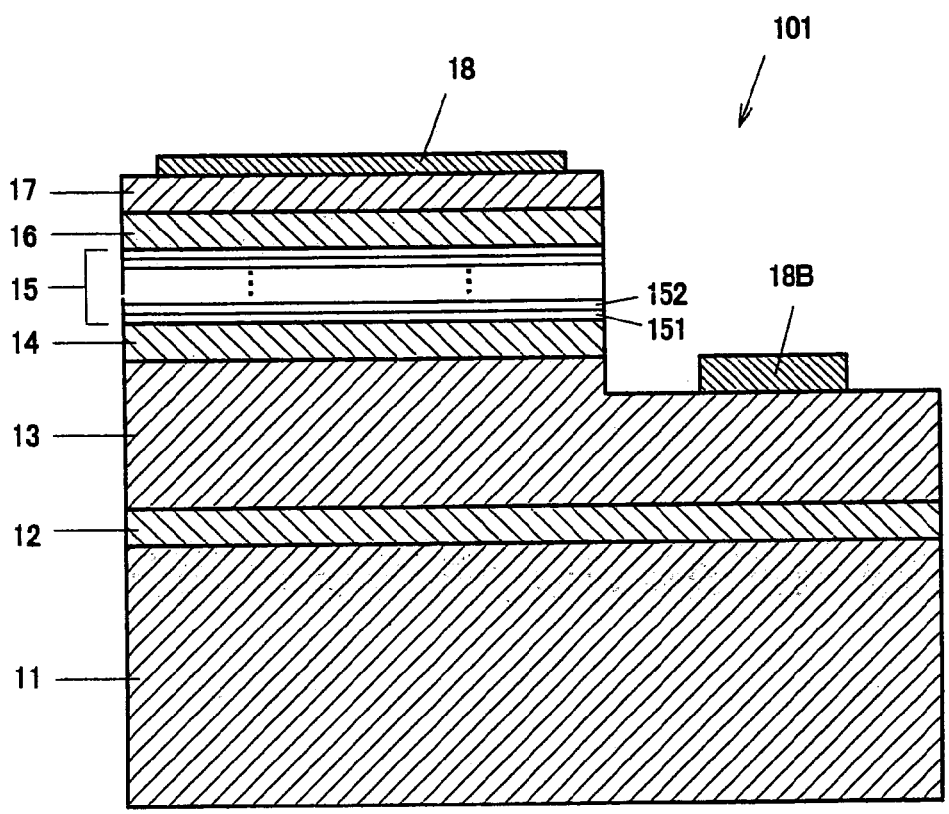
FIG. 4 is a schematic diagram showing the structure of a Group III nitride compound semiconductor device of a second embodiment of the present invention.

FIG. 4 is a schematic cross-sectional view of a flip-chip-type light-emitting diode (LED) 101 according to a second embodiment of the invention, which includes a GaN-based compound semiconductor formed on a sapphire substrate 11. A silicon oxide protective layer is not illustrated in FIG. 4.

As shown in FIG. 4, an aluminum nitride (AlN) buffer layer 12 (thickness: about 25 nm) is formed on the sapphire substrate 11, and a silicon (Si)-doped GaN high-carrier-concentration n+ layer 13 (thickness: about 4.0 μm) is formed on the buffer layer 12. An Si-doped n-type GaN cladding layer 14 (thickness: about 0.5 μm) is formed on the high-carrier-concentration n+ layer 13.

A light-emitting layer 15 having a multiple quantum well (MQW) structure is formed on the cladding layer 14. The light-emitting layer 15 includes six $In_{0.20}Ga_{0.80}N$ well layers 151 (thickness of each layer: about 35 Å) and five GaN barrier layers 152 (thickness of each layer: about 35 Å), the layers 151 and 152 being laminated alternately. An Mg-doped p-type $Al_{0.15}Ga_{0.85}N$ cladding layer 16 (thickness: about 50 nm) is formed on the light-emitting layer 15. A p-type GaN contact layer 17 (thickness: about 100 nm) having an Mg density of $1\times10^{19}/cm^3$ and a hole density $6\times10^{17}/cm^3$ is formed on the cladding layer 16.

A metal nitride electrode 18A is formed on the contact layer 17, and an electrode 18B is formed on the n+ layer 13 which is partially exposed by etching. The electrode 18A connected to the contact layer 17 is formed of a metal nitride film (thickness: 50 nm) comprising at least one of titanium nitride (TiN) and tantalum nitride (TaN). The electrode 18B is formed of a vanadium (V) film (thickness: 200 Å) and a film of at least one of aluminum (Al) and an aluminum alloy (thickness: 1.8 μm).

The electrodes are formed in a manner described below.

In order to form an electrode on the n+ layer 13, an etching mask was formed on the contact layer 17; a predetermined region of the mask was removed; and a portion of the contact layer 17, the cladding layer 16, the light-emitting layer 15, the cladding layer 14, and the n+ layer 13, which was not covered with the mask, were etched by RIE (reactive ion etching) employing a chlorine-containing gas, to thereby expose the surface of the n+ layer 13. A vanadium (V) film (thickness: 200 Å) and a film of at least one of Al and an Al alloy (thickness: 1.8 μm) were deposited onto the exposed surface of the n+ layer 13 through an electron beam method, to thereby form the electrode 18B.

Subsequently, the metal nitride electrode 18A comprising at least one of titanium nitride (TiN) and tantalum nitride (TaN) (thickness: 50 nm) was formed on a portion of the contact layer 17 by means of reactive sputtering.

After the electrodes 18A and 18B were formed, a chamber in which the thus-produced light-emitting diode was placed was evacuated to about $1.3 \times 10^{-6}$ Pa by use of a vacuum pump, and the temperature of the environment was risen to about 800° C. and the light-emitting diode was heated for about 15 minutes. As a result, the resistances of the p-type contact layer 17 and the p-type cladding layer 16 were reduced, and alloying of the contact layer 17 and the metal nitride electrode 18A and alloying of the electrode 18B and the n+ layer 13 were completed.

The value of the contact resistivity of the above-produced electrode 18A was measured by means of a transmission line model (TLM) method. As a result, the value of the contact resistivity was found to be $2 \times 10^{-5}$ Ωcm². The operation voltage of the LED 101 was found to be less than 4 V, and the operation voltage was not increased with passage of time.

What we claim is:

1. A method of forming a p-electrode on a device including a p-type Group III nitride compound semiconductor, said method comprising:

forming said p-electrode comprising a member selected from a group consisting of tantalum nitride ($TaN_x$) and tantalum titanium nitride ($Ta_yTi_{1-y}N_z$) on said p-type Group III nitride compound semiconductor by a reactive sputtering with a mixing gas of nitrogen and a rare gas, wherein said p-electrode comprises a mixture of said member selected from the group consisting of tantalum nitride ($TaN_x$) and tantalum titanium nitride ($Ta_yTi_{1-y}N_z$) and at least one of titanium nitride (TiN), zirconium nitride (ZrN), niobium nitride (NbN), and tungsten nitride (WN).

2. A method of forming a p-electrode according to claim 1, wherein a heat treatment is carried out at 700 to 1000° C. after said sputtering.

3. A method of fabricating a p-electrode, having a low ohmic contact resistance, on a group III nitride compound semiconductor multilayered device, said method comprising:

forming a p-electrode, which comprises at least one of tantalum nitride and tantalum titanium nitride, on a p-type group III nitride compound semiconductor layer; and heat treating said p-electrode at a temperature from 700 to 1000° C., wherein said p-electrode comprises:

said at least one of tantalum nitride and tantalum titanium nitride; and at least one of titanium nitride, zirconium nitride, niobium nitride, and tungsten nitride.

4. The method of claim 3, wherein said forming comprises sputtering using a mixing gas of nitrogen and a rare gas.

5. The method of claim 3, wherein said heat treating results in a contact resistivity, as measured by a transmission line model method, of approximately $2 \times 10^{-5}$ Ωcm².

6. A method of fabricating a p-electrode, having a low ohmic contact resistance, on a group III nitride compound semiconductor multilayered device, said method comprising:

forming a p-electrode, which comprises at least one of tantalum nitride and tantalum titanium nitride, on a p-type group III nitride compound semiconductor layer by sputtering using a mixing gas of nitrogen and a rare gas; and heat treating said p-electrode at a temperature from 700 to 1000° C., wherein said heat treating results in a contact resistivity, as measured by a transmission line model method, of approximately $2 \times 10^{-5}$ Ωcm², and wherein said p-electrode comprises:

said at least one of tantalum nitride and tantalum titanium nitride; and at least one of titanium nitride, zirconium nitride, niobium nitride, and tungsten nitride.

7. A method of fabricating a p-electrode according to claim 6, wherein said heat treating occurs under vacuum for about 15 minutes.

* * * * *